United States Patent [19]
Cronin et al.

[11] Patent Number: 5,136,124
[45] Date of Patent: Aug. 4, 1992

[54] METHOD OF FORMING CONDUCTORS WITHIN AN INSULATING SUBSTRATE

[75] Inventors: John E. Cronin, Milton; Carter W. Kaanta, Colchester; Michael A. Leach, Bristol, all of Vt.

[73] Assignee: International Business Machines Corporation, Armonk, N.Y.

[21] Appl. No.: 585,256

[22] Filed: Sep. 19, 1990

Related U.S. Application Data

[62] Division of Ser. No. 285,186, Dec. 14, 1988, Pat. No. 4,985,990.

[51] Int. Cl.⁵ .............................................. H05K 1/00
[52] U.S. Cl. .................................... 174/261; 174/264
[58] Field of Search .............. 174/261, 258, 257, 255, 174/264; 361/397, 414, 417; 29/847, 831; 428/209, 210, 901

[56] References Cited

U.S. PATENT DOCUMENTS

| | | | |
|---|---|---|---|
| 3,913,223 | 10/1975 | Gigoux | 174/261 |
| 4,622,058 | 11/1986 | Leary-Renick et al. | 29/847 X |
| 4,866,507 | 9/1989 | Jacobs et al. | 361/397 X |
| 4,879,156 | 11/1989 | Herron et al. | 428/901 X |

Primary Examiner—Leo P. Picard
Assistant Examiner—Trinidad Korka
Attorney, Agent, or Firm—Calfee, Halter & Griswold

[57] ABSTRACT

A method for forming an electrically conductive line between two layers of insulating material and method for connecting the line through both layers of the insulating material to the opposite surfaces is provided. In the method, first, second and third layers of insulating material are provided wherein the first and third layers are separated by the second layer of insulating material which is different in etch rate from the first and third layers. The edge portion of all three layers is exposed and the insulating layer of the second material is selectively etched to remove the revealed edge portion and provide a slot between the first and third layers of insulating material. Also openings are provided in both the first and third layers of insulating material which communicate with the slot and extend respectively through the layers of the first and third insulating material. Thereafter, a conductive material such as tungsten is deposited in the slot and the openings and also on the face of the stacked insulating material. Finally, the excess tungsten is removed from the faces of the insulating material of the first and third layers leaving a conductive line sandwiched between the first and third insulating layers of the material; also metal remains in the openings formed to thereby form conductive studs extending from the line to the opposite surfaces of the insulating material sandwich so formed.

4 Claims, 5 Drawing Sheets

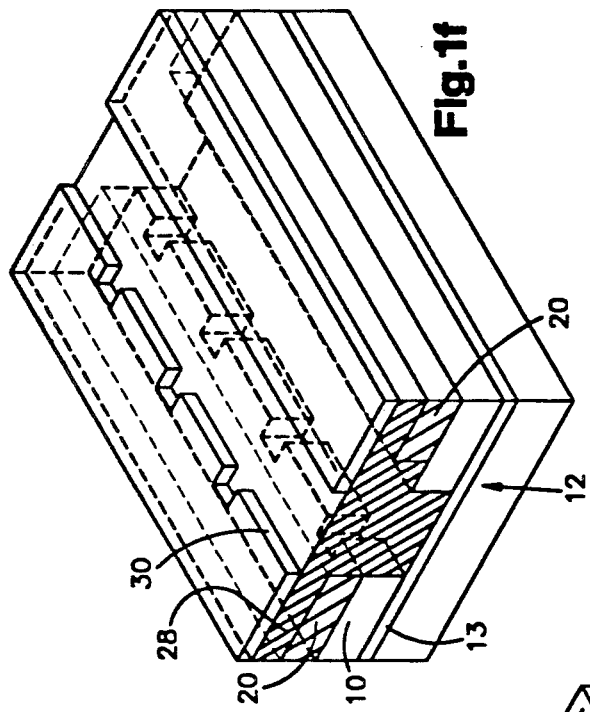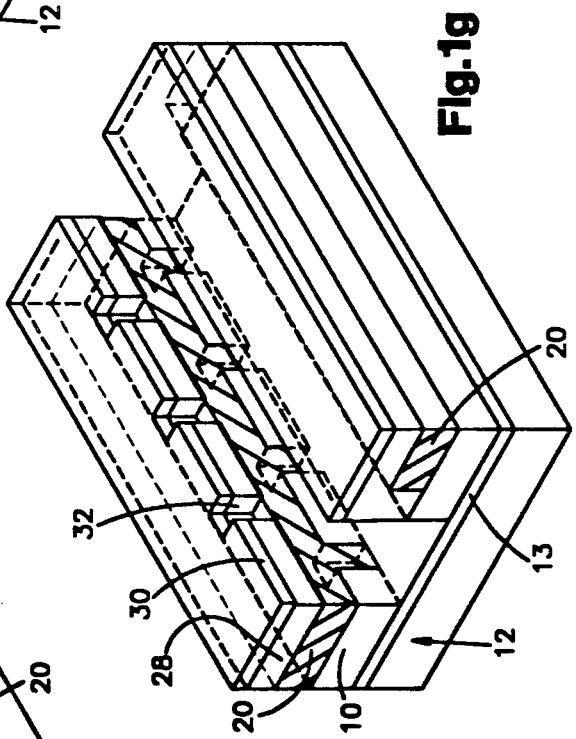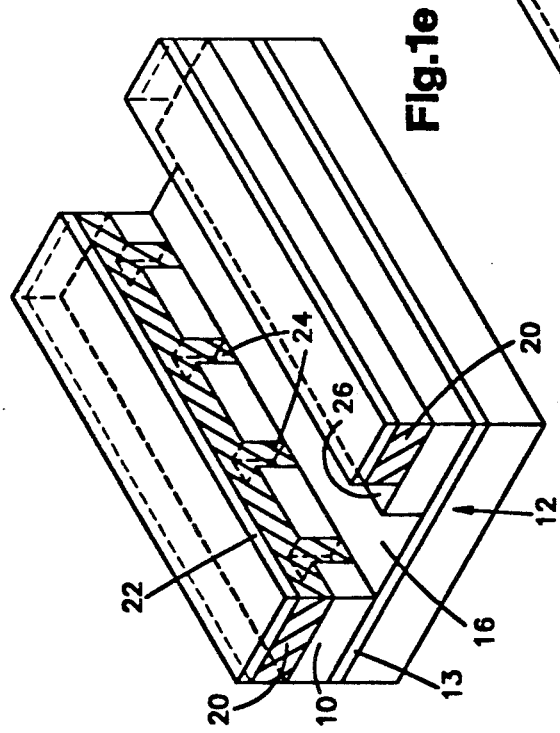

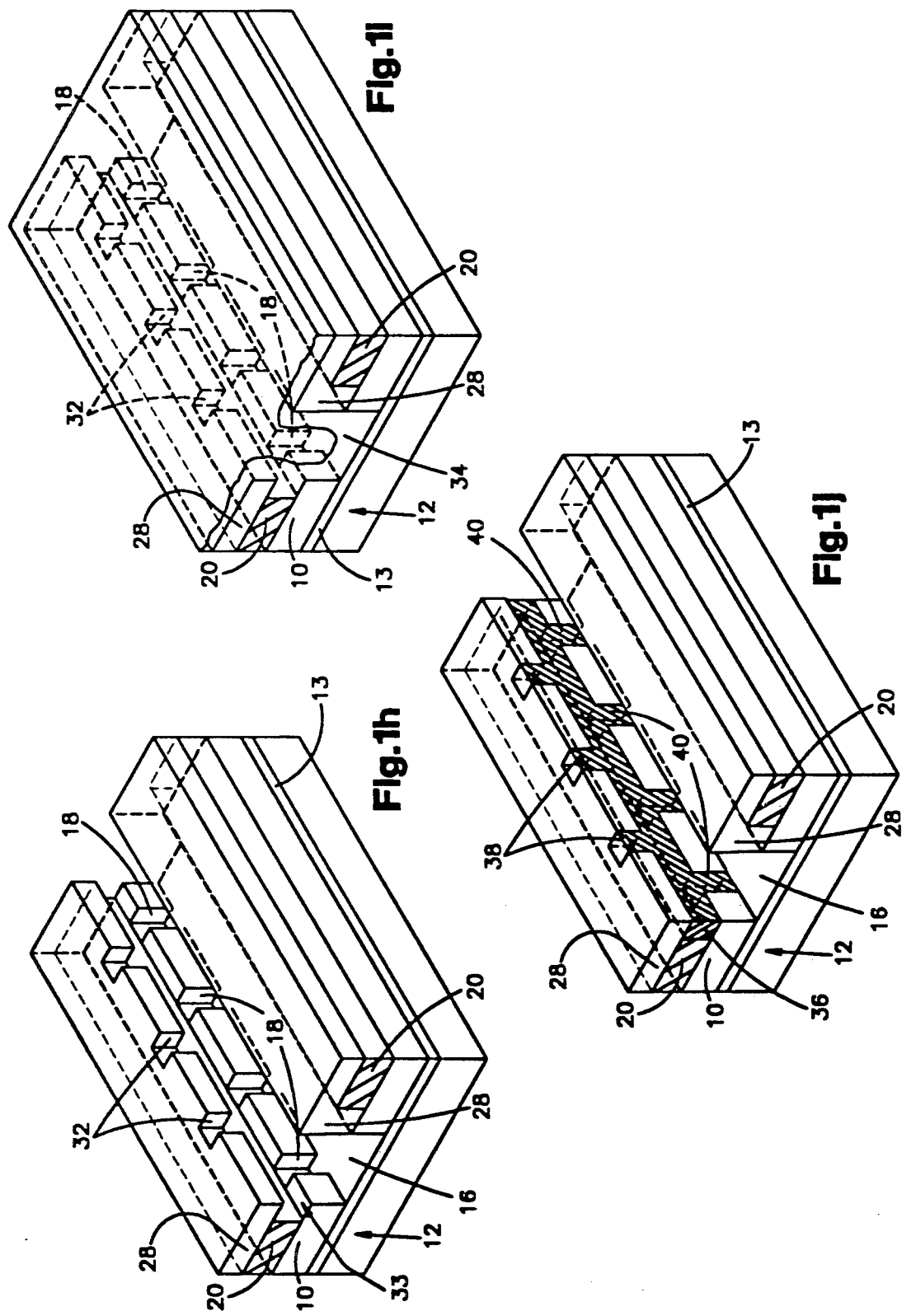

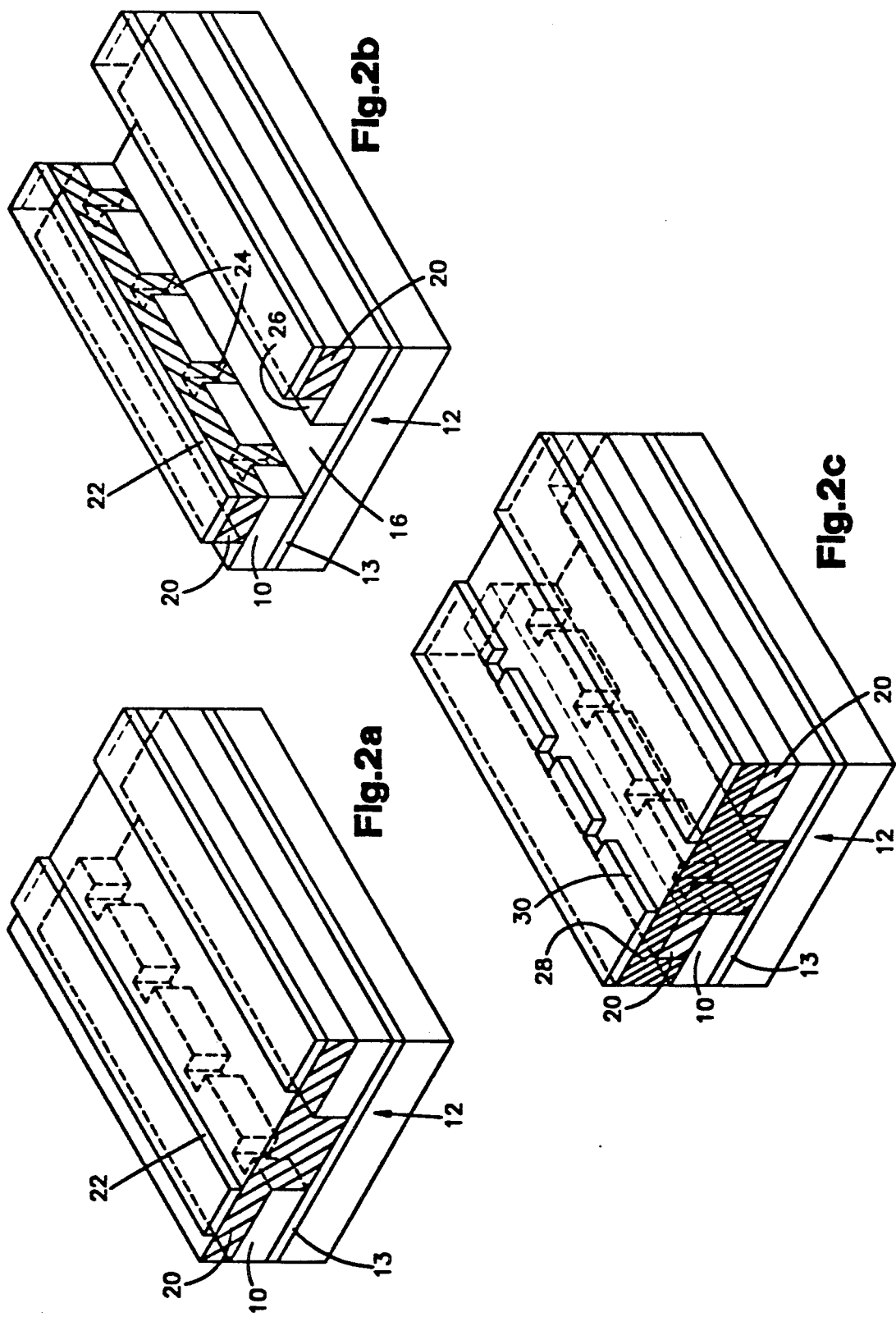

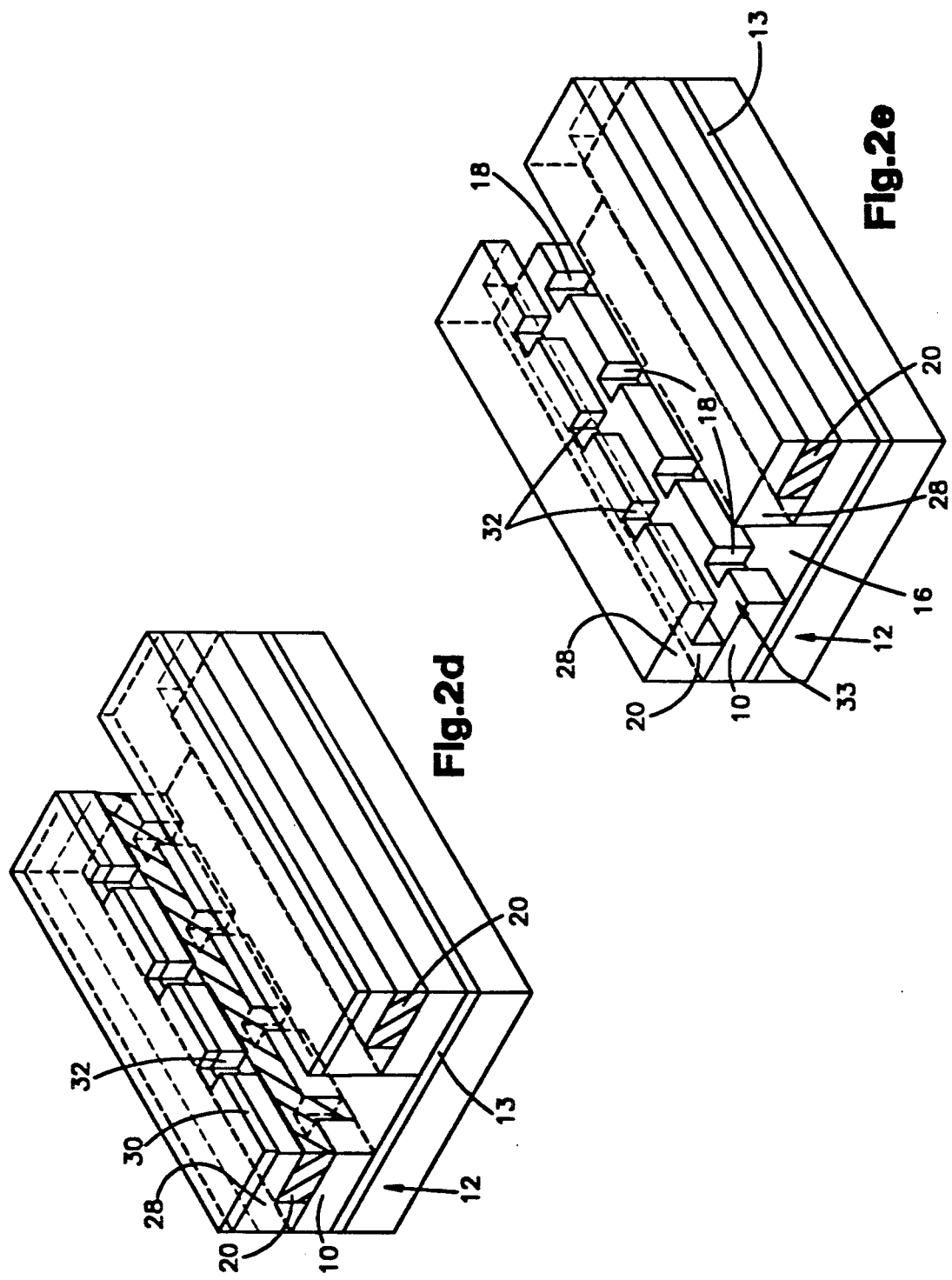

METHOD OF FORMING CONDUCTORS WITHIN AN INSULATING SUBSTRATE

This is a divisional of co-pending application Ser. No. 285,186 filed on Dec. 14, 1988 now U.S. Pat. No. 4,985,990.

BACKGROUND OF THE INVENTION

1. Field of the Invention

This invention relates generally to the formation of metal lines embedded in substrates and their interconnections through the substrates, and more particularly to a method for forming metal conductors imbedded within the substrate and which conductors have metal connections extending to the opposite surfaces of the substrate. In even more particular aspects, this invention relates to a method of forming a metal line between two layers of insulating material which form a substrate or a portion of the substrate and concomitantly forming metal studs which extend through the layers of the substrate material to thereby provide electrical interconnections from either side of the substrate to the metal connection line embedded within the substrate.

2. Prior Art

As the dimensions of the ULSI circuitry becomes smaller and smaller with the advancement of technology, it becomes increasingly necessary to form smaller metal conductors within an insulating substrate and provide precise connections to surfaces on both sides of the insulating substrate all within a very small and closely controlled dimensions. Also, technology is advancing such that electrical devices can be formed on side walls of trenches, which devices must be wired, or connected. In the past, it has been conventional practice to form the substrate in several different layers depositing the metal layers between the insulating materials and then etching the exposed metal to the desired pattern. The etched pattern is connected to various levels by means of metal fill vias formed through the insulating layers. While this does work quite well in many instances, it is difficult to obtain very close tolerances with small lines requiring precision interconnection to the opposite surfaces. Further, this technique cannot be readily implemented in side wall electrical device technology.

SUMMARY OF THE INVENTION

According to the present invention a method of providing electrical conductive material between two layers of insulating materials is provided. The method comprises the steps of providing first, second and third layers of insulating material wherein the second layer of insulating material is interposed between said first and third layers. The second layer has an etch rate which differs from that of said first and third layers and which can be selectively removed without removing the material of the first and third layers. At least one edge portion of the stacked layers of material is exposed. Thereafter an edge portion of the second material is selectively removed from the exposed portion to provide a slot or undercut between the first and third layers of insulating material. Thereafter a conductive material is deposited in said slot and around the exposed edge portions of the first and third layers of insulating materials. Finally, the conductive material laying outside of the slot around the edge portion of the remaining insulating material is removed to thereby provide a conductive line between two layers of insulating material.

DESCRIPTION OF THE DRAWING

FIGS. 1a through 1j depict, somewhat diagrammatically, sequentially the steps of the preferred embodiment of the present invention; and FIGS. 2a and 2e depict a somewhat modified version of certain of the steps of the invention from those of FIGS. 1a through 1h.

DESCRIPTION OF THE PREFERRED EMBODIMENT

Figure 1A:
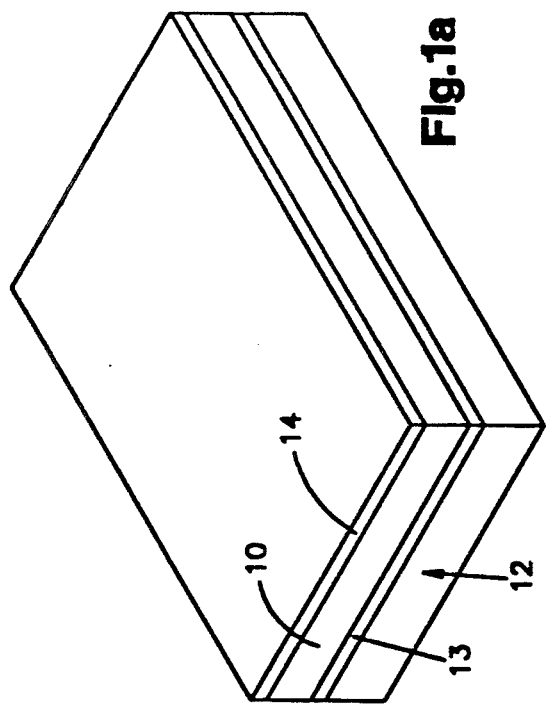

The invention can best be understood by referring to the drawings which depict sequentially the steps involved in the present invention.

As shown in FIG. 1a, a layer of insulating material 10, preferably silicon dioxide, is mounted or deposited on a base layer 12. The deposit is preferably by chemical vapor deposition (CVD). One preferred technique is performed in a parallel plate reactor using 2% silane ($SiH_4$) with a carrier of He, with an $N_2O$ flow of 0.75 liters/min. at a pressure of 1.9 Torr at 300° Centigrade, the upper electrode being biased. The base layer preferably is a silicon substrate which has an etch stop 13 such as $Al_2O_3$ coated thereon, by conventional methods such as reactive sputtering.

Figure 1B:
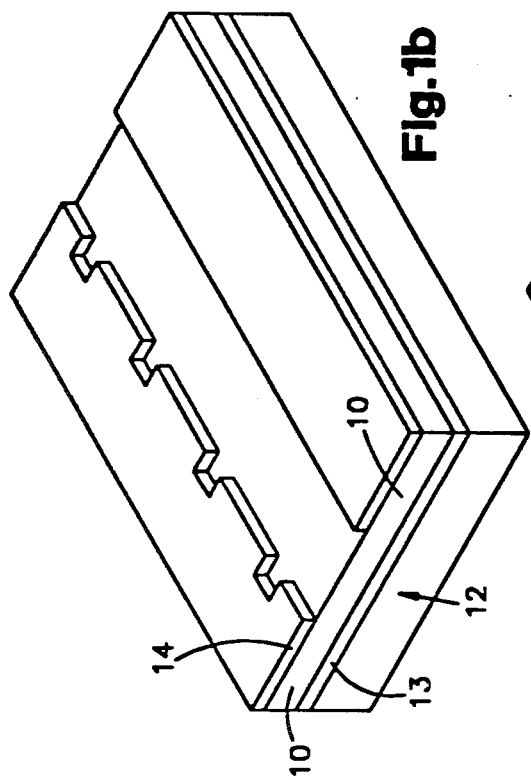
Figure 1C:
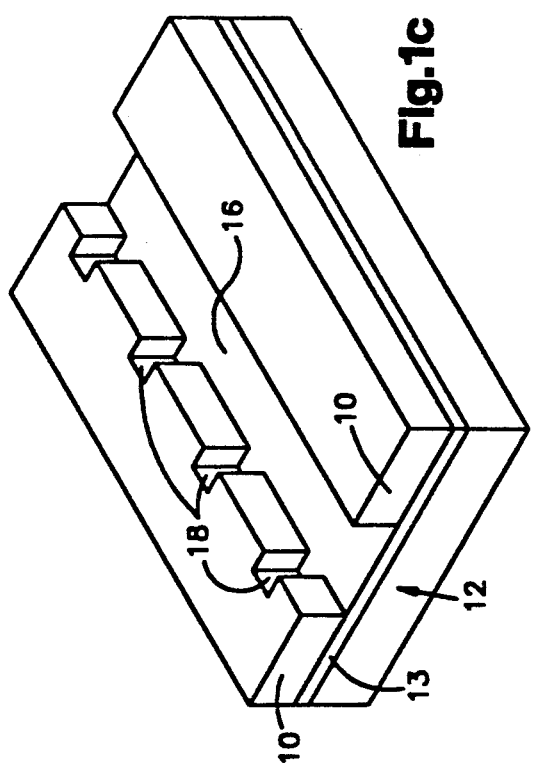

A layer of photoresist material 14 is applied on to the insulating layer 10. Any conventional photoresist material may be used; and, by conventional photo-lithographic techniques, the photoresist material 14 is exposed and developed to reveal the underlying substrate 10 in the pattern as shown in FIG. 1b. The structure is then etched to remove the exposed silicon dioxide in the layer 10, the remaining photoresist material acting as an etch mask. The etching is preferably done by reactive ion etching techniques in $CHF_3 + CO_2$ or $CF_4$ at a 100 Millitorr or less. The etching continues until all the exposed material has been removed to the stop 13. Following this the remaining photoresist material is removed with the resulting structure being as shown in FIG. 1c in which a trough or trench 16 has been etched into the silicon with groove 18 extending orthogonally therefrom.

Figure 1D:
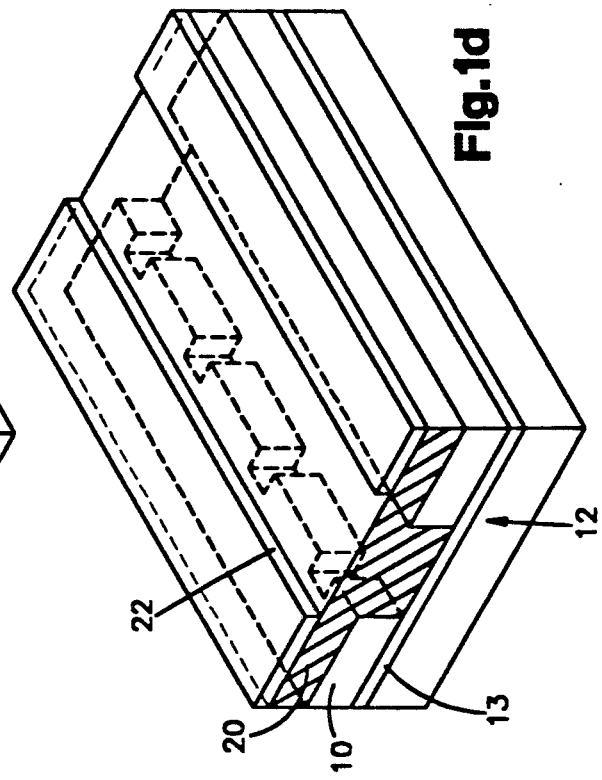

At this point a second layer of a second insulating material 20 is blanket deposited over the first insulating layer 10 and the exposed portion of the underlying stop 13 and preferably is planarized. It is essential that the second insulating material be of a different composition or structure from the first insulating material or in some other way differs such that it will react with an etch media which is essentially unreactive or much less reactive to the first insulating material. Expressed another way, the material 20 must have an etch rate in some etch medium which differs from that of the material 10. In the preferred embodiment this second insulating material 20 is silicon nitride $Si_3N_4$. A preferred method is utilizing plasma enhanced chemical vapor deposition (PECVD). Preferably it is done in Silane ($SiH_4$) and ammonia ($NH_3$) with 175 SCCM of Silane and 325 SCCM of $NH_3$, a presence of 2 Torr and at 375° C., with a power of 175 watts. A photoresist material 22 is then applied over the insulating material 20 and exposed and developed to reveal the underlying insulating material in the layer 20 as shown in FIG. 1d. It will be noted in this embodiment that the edge of the remaining photoresist material, which will act as an etch mask, on the left side 24 is coincident with the edge of the insulating material 10 whereas the edge of the remaining photoresist material on the right side is somewhat offset with the edge of the insulating material 10 on its right side 26 where the trough 16 is forming a step 26 as shown in FIG. 1e.

At this point, the silicon nitride is etched anisotopically preferably by reactive ion etching in $CHF_3+CO_2$ at a low pressure, e.g., 30 Millitorr or less. This will selectively anisotopically etch the silicon nitride but will be essentially unreactive with the silicon dioxide in the insulating layer 10. The resulting structure is as shown in FIG. 1e.

At this point the remaining photoresist material 22 is removed and a third insulating material 28 which must have a different etch rate from that of the insulating material in the second layer and preferably is the same as the insulating material of the first layer, i.e. $SiO_2$ is deposited uniformally over the insulating layers 10 and 20 completely filling the trough 16. It should be noted at this point that the groves 18 in insulating layer 10 are filled with the silicon nitride material of the insulating layer 20.

A layer of photoresist 30 is applied on top of the third insulating layer 28 and exposed and developed to reveal the underlying silicon dioxide in the insulating layer 28 as shown in FIG. 1f. It should be noted that the right side of the remaining photoresist material coincides with the right side of the insulating layer 10 and overhangs the right side of the insulating layer 20 and the left hand side of the exposed photoresist is coincident with the left hand sides of both the insulating layer 10 and the second insulating layer 20. This is shown in FIG. 1f.

The revealed silicon dioxide of the insulating layer 28 is then etched preferably by reaction ion etching techniques as previously described in $CHF_3+O_2$ at 200 Millitorr or less which will result in the structure shown in FIG. 1g. In this structure groves 32 are formed in layer 28 which extend orthogonally with respect to the central trough 16. The remaining photoresist material is then removed.

Following the removal of the photoresist material 30, the silicon nitride insulating layer 20 is isotopically etched by any conventional technique which will etch the silicon nitride but not the $SiO_2$. A preferred technique is to utilize hot phosphoric acid ($H_3PO_4$). This will undercut the silicon nitride layer forming a longitudinally extending slot 33 as shown in FIG. 1h. This will also remove the silicon nitride in slots 18, also as shown in FIG. 1h. It should be noted that this slot 33 is formed only on the left hand side of the structure where the silicon nitride is exposed and not on the right side where the layer 28 of the silicon dioxide covers the edge of the silicon nitride in the insulating layer 20.

At this point a layer of metal 34 is conformably deposited as shown in FIG. 1i. Preferably this metal is tungsten which is blanket deposited by conventional CVD techniques. A preferred method of blanket depositing the tungsten is to first deposit a seed layer about 500 angstroms thick of tungsten silicide ($WSi_2$) is a chemical vapor deposition process utilizing $WF_6$ $H_2$ and $SiH_4$ gasses at a pressure of about 150 Millitorr and a temperature of about 450° Centigrade. Following the deposition of the seed layer a tungsten metal is deposited also utilizing CVD techniques in $WF_6$ $H_2$ and $SiH_4$ gases at about 150 Millitorr and 450° Centigrade. These depositions can take place in a coldwall reactor, such technique for deposition of tungsten being well known in the art.

Finally, the tungsten is subjected to a wet chemical etch of dilute peroxides which stops on the seed layer of $WSi_2$. The seed layer is etched in a 20/1 ratio of nitric acid and ammonium fluoride. This etch will not etch tungsten or oxides. These combine etches will remove the tungsten and $WSi_2$ on the exposed edges of the stack of insulating layers 10 and 28, and the etching is stopped when only the tungsten and $WSi_2$ which is deposited in the slot 33 and in the groves 18 and 32 still remains. This final structure is shown in FIG. 1j, the resulting structure being an electrical line 36 disposed between insulating layers 10 and 28 with upwardly extending studs 38 to form electrical connections extending through openings in the insulating layer 28 and downwardly extending studs 40 to form electrical connections through openings in the insulating layer 10.

At this point, the basis wiring plan is established and the structure so formed can be utilized for various wiring schemes on various devices. For example, this technique is particularly useful if one wishes to have sidewall formed semiconductor devices, since it provides a very viable and well designed technique for connecting to sidewall formed devices.

Further it should be understood that there are many modifications of the very specific technique which has been described. For example, if one wished to have wiring on both sides of the opening then the right side of the opening could be formed similarly to the left side which would provide wiring on that side as well.

Further, if it is anticipated or determined that there are or may be problems controlling the etching of the silicon nitride layer isotopically by the hot phosphoric acid to form a uniform undercut as shown in FIG. 1h, then the process can be slightly modified as follows:

In the step of applying the photoresist 22 over the silicon nitride 20 as shown in FIG. 1d, the photoresist is applied in a band or strip about one micron wide or whatever size is desired for the final electrical line width as shown in FIG. 2a. Hence, when the anisotropic etch in $CHF_3+CO_2$ is performed, the exposed silicon nitride to the left of the photoresist 22 is also removed as well as that in the trough 16, leaving a silicon nitride band 20 of about 1 micron in width below the photoresist 22 as shown in FIG. 2b. In the subsequent steps the photoresist 22 is removed, and the silicon dioxide 28 is deposited as previously described, and the photoresist 30 is applied thereon and patterned as previously described, as shown in FIGS. 2c, and the $SiO_2$ 28 etched to form the structure shown in FIG. 2d. As shown in FIG. 2c through 2e, the layer of silicon dioxide 28 also fills in to the left of the silicon nitride layer 20; thus, when the hot phosphoric acid isotopically etches the silicon nitride 20 to produce the structure shown in FIG. 2e, the etching will automatically be stopped when all of the silicon nitride has been etched to reveal the layer of silicon dioxide 28 adjacent the silicon nitride. The metal can then be deposited and etched in the same manner as described in the previous embodiment and shown in FIGS. 1i and 1j.

While the invention has been described, with a certain degree of particularity, various adaptations and modifications can be made without departing from the scope of the invention as defined in the appended claims.

What is claimed is:

1. A multi-layer substrate for mounting electrical devices on at least one side thereof comprising, first and second layers of dielectric material in superposed relationship, an electric line with portions interposed between said first and second layers of dielectric material, said electric line having at least two studs at least one of which extends through said first layer of said dielectric material and at least one thereof which extends through said second layer of said dielectric material at spaced locations to provide an electrical path between said studs through said electrical conductive material, said electrical line being a single unitary mass of material, free of interfaces and connections there between.

2. The structure as defined in claim 1 wherein there are a plurality of spaced apart electrical lines within said substrate.

3. The structure as defined in claim 2 further characterized by insulating material interposed between said electrical lines.

4. The structure as defined in claim 3 wherein said insulting material interposed between said electrical lines is a different material from the material of said layers of dielectric material.

* * * * *